United States Patent [19]
Kessler, Jr.

[11] 3,946,429
[45] Mar. 23, 1976

[54] SELF-FUSING TRANSCALENT ELECTRICAL DEVICE

[75] Inventor: Sebastian William Kessler, Jr., Lancaster, Pa.

[73] Assignee: RCA Corporation, New York, N.Y.

[22] Filed: Dec. 20, 1974

[21] Appl. No.: 534,879

[52] U.S. Cl. .............. 357/81; 165/80; 357/82; 317/40 A
[51] Int. Cl.² H01L 23/02; H01L 25/04; F28F 7/00; H02H 5/04
[58] Field of Search .......... 357/81, 82; 317/40, 230; 165/80

[56] References Cited
UNITED STATES PATENTS

| | | | |
|---|---|---|---|
| 3,204,156 | 8/1965 | Moresi et al. | 317/230 |
| 3,700,969 | 10/1972 | Furnival | 317/40 |
| 3,739,235 | 6/1973 | Kessler | 357/82 |
| 3,852,806 | 12/1974 | Corman et al. | 357/82 |

Primary Examiner—Andrew J. James
Attorney, Agent, or Firm—Glenn H. Bruestle; George E. Haas

[57] ABSTRACT

A cooling chamber is bonded to an electrical device to be cooled. The chamber includes a metal wall connecting the device into the working electrical circuit. A thinned portion of the metal wall forms a fuse which will burn out due to an excessive flow of current through the electrical device upon failure.

8 Claims, 2 Drawing Figures

SELF-FUSING TRANSCALENT ELECTRICAL DEVICE

The invention is directed to an electrical device of the type requiring cooling during its use. For example, semiconductor devices, such as thyristors or silicon controlled rectifiers, operate in conductive states where the current flow through the device produces a relatively large amount of heat. This heat must be dissipated to prevent breakdown or destruction of the device.

BACKGROUND OF THE INVENTION

Electrical devices of various types may be cooled during operation by cooling chambers which are bonded directly to the electrical device and provide for the circulation of a cooling liquid. One type of an electrical device may be a semiconductor component such as a thyristor or silicon controlled rectifier which is cooled by a pair of cooling chambers fixed to the opposed major surfaces of the wafer forming the semiconductor portion of the device. Such cooling chambers provide for the circulation of a cooling liquid, as a heat pipe, or a cooling jacket or manifold for forced circulation of the cooling liquid. A semiconductor device of this type is described in detail in U.S. Pat. No. 3,739,235 issued to Sebastian William Kessler, Jr. on June 12, 1973. The semiconductor wafer of the type described in the patent has a conductive cathode electrode coating on one major surface of the wafer and a conductive anode electrode coating on the opposite major surface of the wafer to which the cooling chambers in the form of heat pipes are attached.

The cooling structure may consist principally of a hermetically closed metal chamber having one portion bonded to one of the two major surfaces of the semiconductor device. An electrical connector terminal is fixed to a part of the metal chamber at a position spaced from the respective conductive anode or cathode coating of the semiconductor wafer. The terminal serves to connect the semiconductor device into the external working circuit. This particular arrangement utilizes the cooling chamber as the electrical lead to the respective anode or cathode coating on the opposed surfaces of the wafer.

When thyristors and rectifiers of the type described above are used in a circuit, currents as high as 20,000 amperes or more can be developed. The semiconductor device is frequently protected with a special fuse connected in series with it. However, such fuses are expensive and often cost as much as the semiconductor device itself. This, then, has led some manufacturers of equipment to question the economy of protecting a semiconductor device with a fuse which is as expensive. For this reason, many circuits are designed without any fuse protection of the circuit and equipment. When the thyristor or rectifier fails by a breakdown of the semiconductor wafer, the large flow of current through the device tends to melt the mass of metal in contact with the wafer so that it fuses together and the semiconductor wafer is shorted, thus allowing short circuit currents to surge through the circuit or equipment. With no fuse protecting the circuit, the equipment can be destroyed and much damage can result.

SUMMARY OF THE INVENTION

In accordance to embodiments of this invention, a cooling chamber bonded to an electrode of an electrical component has a thinned region of the chamber wall completely separating the electrode of the component from that part of the chamber wall to which a connector terminal is fixed.

The thinned wall portion has a thickness sufficient to conduct the peak surge current and the $I^2t$ ratings between the electrode and the connector terminal during normal operation of the electrical device. If, however, for some reason the electrical component breaks down and becomes highly conductive, an abnormal flow of current will cause the thinned wall region of the cooling chamber structure to melt and separate the electrode of the device from the connector terminal.

The cooling chamber may be one of two hollow metal cylinders. The thinned wall region may be an annular wall portion extending around one of the metal cylinders between the respective connector terminal and the electrical device. The annular wall portion may extend continuously around the cylinder. A further modification of the invention encloses the thinned wall region of the cooling chamber within a closed envelope.

Figure 1:
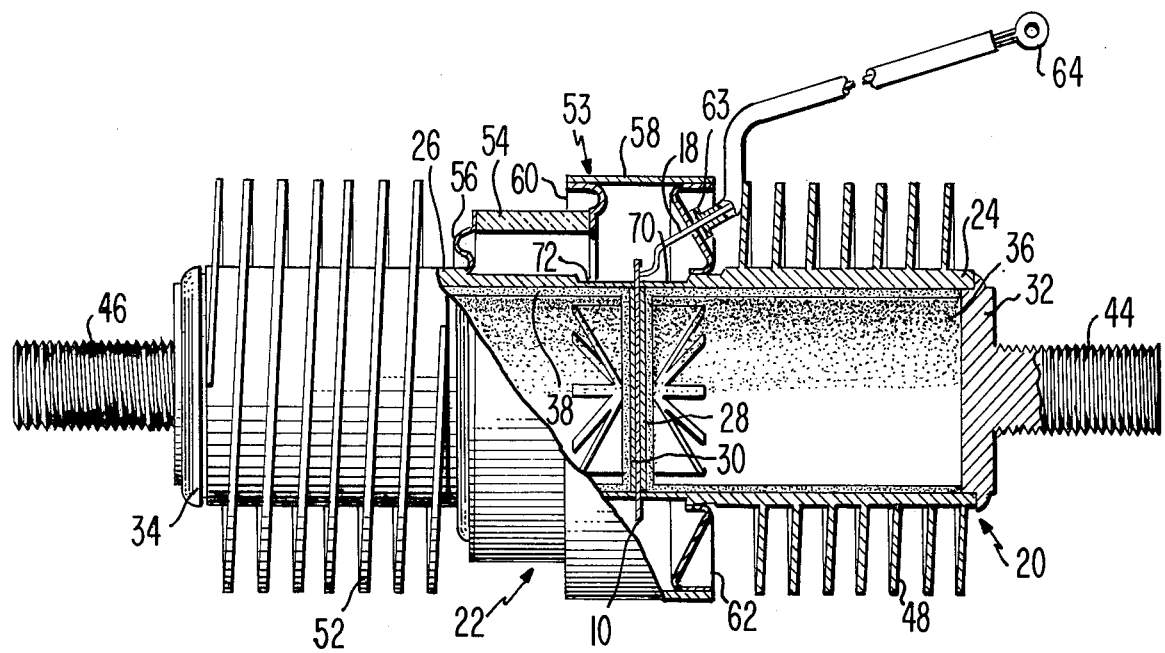
FIG. 1 is a longitudinal view, partially in section, of a semiconductor thyristor, in accordance with one embodiment of the invention.
Figure 2:
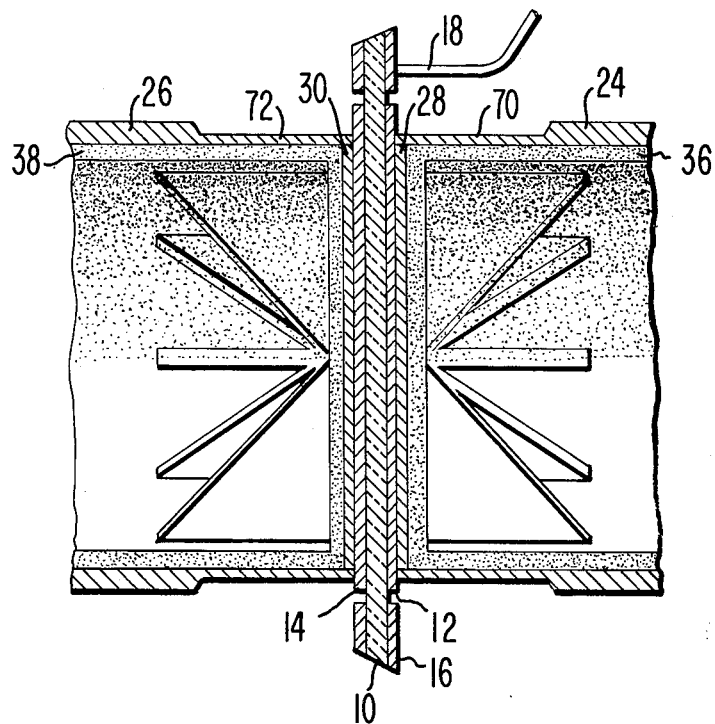
FIG. 2 is an enlarged sectional view of a portion of the semiconductor device of FIG. 1.

A specific embodiment of the invention is shown in FIGS. 1 and 2, and is confined to a semiconductor thyristor cooled by heat pipe structures bonded to the thyristor. The semiconductor device may be of the type described in detail in U.S. Pat. No. 3,739,235, referred to above. The device comprises a semiconductor wafer 10 of silicon which is formed of layers of doped semiconductor material providing an NPNP semiconductor thyristor device. Shown in detail in FIG. 2, the layered wafer 10 includes on one major surface a cathode electrode conductive coating 12 and on the opposite major surface of the wafer a conductive anode electrode coating 14. Although not shown in the figures, the configuration of the wafer 10 is that of a substantially round disc.

On the same major surface of the wafer 10 and adjacent to the cathode electrode coating 12 is an annular conductive coating 16 forming the gate electrode. A conductive metal lead structure 18 is brazed to the gate electrode 16.

Bonded directly to the opposite major surfaces of the semiconductor 10 are two cooling chambers fabricated as heat pipes 20 and 22, respectively. The heat pipes include two hermetically closed copper cylinders 24 and 26. One end of the cylinder 24 is closed by a metal wall portion consisting of a round metal plate 28 brazed across the open end of the cylinder 24. In a similar manner, the corresponding open end of the cylinder 26 is closed by a second metal plate 30 brazed across its open end. The opposite ends of cylinders 24 and 26 are closed by metal plates 32 and 34. The plate 32 is brazed to the outer end of the cylinder 24 and the plate 34 is brazed to the outer end of the cylinder 26. The cylinders 24 and 26 are conductively bonded directly to the respective electrode conductive coatings 12 and 14.

Also, all the matching surface areas of the corresponding end plates 28 and 30 are brazed or soldered to the electrode coatings 12 and 14 respectively of the thyristor to provide good electrical and thermal contact between these parts.

The inner surfaces of both of the heat pipes 20 and 22 are covered with capillary wick liner structures 36 and 38 of porous copper metal, which extend over and are bonded tightly to the inner surfaces of the closed cylinders 24 and 26 respectively. An amount of a working fluid, such as water within the heat pipes, is used.

To further aid in the cooling of the heat pipe cylinders, a spiral thin metal fin structure 48 is bonded to the external surface of cylinder 24 and a similar fin structure 52 is bonded to the external surface of cylinder 26. These fins 48 and 52 provide a greater surface area for air cooling of the outer surfaces of the heat pipe cylinders 24 and 26, respectively.

The cylinder 24 provides an electrical cathode lead from an external circuit to the cathode electrode coating 12 and the heat pipe cylinder 26 provides the anode lead directly to the anode electrode coating 14. The external circuit is connected to the cylinders 24 and 26 by a threaded cathode bolt 44 fixed to the end plate 32 of the cylinder 24 and a threaded anode bolt 46 connected to the end plate 34.

To further protect and shield the exposed portions of the semiconductor wafer 10 there is provided a further envelope structure 53 extending between the two heat pipes. This envelope structure includes a ceramic cylinder 54 coaxially positioned around the heat pipe cylinder 26 and bonded thereto by a Kovar (T.M.) flanged-disc 56 brazed at its outer periphery to one end of the ceramic cylinder 54 and at its inner periphery to the outer wall of cylinder 26. A weld sleeve 58 made of Kovar (T.M.), for example, is attached to the ceramic ring 54 by an annular ring 60 brazed to one end of the Kovar seleve 58 and joined at its inner periphery to the other end of the ceramic ring 54. The other end of the weld sleeve 58 is bonded to the outer surface of the heat pipe cylinder 24 by means of the annular ring 62, which is brazed at its outer periphery to the other end of the Kovar weld sleeve 58 and at its inner periphery to the outer surface of cylinder 24. The lead 18 to the gate electrode coating 16 extends through an opening in the ring 62 and the ceramic insulator 63 and is attached to a lead terminal 64, as indicated in FIG. 1. Lead 18 is used to connect the gate electrode into the external working circuit. The annular rings 56, 60 and 62 are of an irregular cross-sectional design to provide strain isolation connections between the rings 54 and 58 and the cylinders 24 and 26.

The cylinders 24 and 26 form the conductive connections between the respective connector terminals 44 and 46 and the electrode coatings 28 and 30 to which the heat pipes are bonded. In accordance with an embodiment of the invention, the metal walls of cylinders 24 and 26 have respective thinned wall regions 70 and 72 completely separating the portions of the cylinders to which the respective connector terminals 44 and 46 are attached from the respective electrode coatings 28 and 30 to which the heat pipes are bonded.

The thinned wall regions 70 and 72 are formed with an annular cross-sectional area which, with the wick liners 36 and 38, will fuse at the desired maximum current from which the circuit is to be protected. That is, if the wafer 10 breaks down and becomes entirely conductive during its use, an excessive amount of current will flow through the device and through the circuit to which it is connected. If this breakdown current is excessive and greater than the maximum current which the thinned wall regions 70 and 72 and the respective wick liners can conduct, these thinned wall regions will fuse and the device will fail in an open position, i.e. the fusing will be of a nature that either one or both of the thin walled regions 70 and 72 will melt and form an annular break to completely separate the respective heat pipe cylinder from the wafer 10. The required cross-sectional area for either of the thinned wall regions 70 or 72 and for the wick liners can be determined from tables indicating the cross-sectional areas at which fusing takes place for various diameters of copper wire. Because of the porous nature of the wick liners only 50 percent of the cross-sectional area of the wick needs to be considered.

A semiconductor thyristor of the type described above and shown in FIGS. 1 and 2 was operated to a breakdown condition of the wafer 10, with a pulsed 60 Hz current. Upon breakdown the measured peak current was 4345 amperes. An oscillograph record of the failure of the device indicated that the rectifier operated for 9.25 cycles, then failed in a closed, or shorted position. After 30.75 additional cycles, the rectifier opened, preventing any further flow of current. Upon examination, it was seen that the thinned wall portions and the wick liners of both of the heat pipes had melted as a fuse thus opening the circuit. Without the thinned wall fuse regions, similar to those shown at 70 and 72 of FIG. 2, for example, the wall portions of both cylinders would have been great enough to have conducted, without fusing, even larger currents than the measured current of 4345 amperes for more than the 30.75 cycles, thus greatly endangering other parts and equipment connected into the circuit.

The fuse structure of the thinned wall regions 70 and 72 are disclosed as annular wall portions substantially coaxial with the axis through the wafer 10 and normal to the major surfaces of the wafer. This axis is also coincident with the axes of the heat pipe cylinders 24 and 26. The respective thinned wall regions 70 and 72 are shown in the figures as being at the ends of the respective heat pipe cylinders with the outer ends of the thinned wall regions bonded directly to the respective coatings 12 and 14. It is obvious, however, that modifications of the shown structure are possible, wherein it may be only necessary to have a single thinned wall region as a part of only one of the cylinders 24 and 26. A further embodiment of the invention may be the provision of one or both of the thinned wall regions 70 and 72 at any position along the length of the cylinders 24 and 26 between the wafer 10 and the respective conductor terminals 44 or 46. It is only necessary that the conductive path between the terminals 44 and 46 and the respective electrode coatings 12 and 14 be completely interrupted by the thinned wall regions, so all of the current flow passes through the thinner wall regions.

It is also within the scope of the invention to utilize thinned wall regions in other configurations of cooling chambers than the cylindrical heat pipe structures shown in FIGS. 1 and 2. Chambers 24 and 26 could be spherical or cubic or any other shape which lends itself appropriately to the cooling of a hot device. These other configurations of cooling chambers would also have thinned wall regions completely separating the device to be cooled from the respective connector terminals.

The two end plates 28 and 30, bonded respectively to the electrode coatings 12 and 14, aid in the conduction of current from the wafer to the conductive heat pipe walls. Since these plates are bonded in an electrically conductive way directly to the electrode coatings 12 and 14, current flow through the wafer 10 is substantially through all portions of the plates 28 and 30. In this manner the plates provide a spreading out of current flow between the wafer coatings 12 and 14 and the conducting side walls of the cylinders 24 and 26. This construction prevents the development of hot spots or resistance paths between areas of the wafer and the cylindrical walls of the conductive heat pipes.

As shown in FIG. 1, the thinned wall regions 70 and 72 are enclosed within the envelope 53. This has at least two advantages in that when the wafer 10 breaks down and a high surge of current causes the thinned wall regions to fuse, the envelope 53 will prevent sputtered metal from the wall cylinders 24 and 26 from being scattered over other portions of the equipment and circuit. Furthermore, when one or both of the thinned wall regions 70 and 72 melt to form a complete break in one or both of the walls of the heat pipes, the envelope 53 rigidly bonded to the cooling cylinders 24 and 26 retains these cylinders spaced apart, so that the cylinder walls will not come together again and provide a short circuit.

A preferred embodiment of the invention utilize copper cylinders 24 and 26, which are machined to provide the desired wall thickness of around 0.038 cm. Molybdenum end plates 28 and 30 are brazed into the opposite ends of cylinders 24 and 26 with a gold-nickel alloy composition. The inner surfaces of cylinders 24 and 26 and those of end plates 28 are nickel plated. The outer surfaces of plates 28 and 30 are ground to provide an accurate flatness of the surfaces, so as to form a good matching fit to the respective flat opposed surfaces of wafer 10. The semiconductor wafer may be formed in the manner disclosed in the above cited U.S. Pat. No. 3,739,235 with the opposed electrode coatings 12 and 14 respectively brazed to the ends of cylinders 24 and 26.

The embodiments of the invention are described above as being specifically related to a semiconductor device 10 and to two cooling chambers, in the form of heat pipes. However, the invention can be as well embodied in electrical devices of other types requiring cooling, such as that disclosed in U.S. Pat. No. 3,605,074 to Freggens, for example. Furthermore, the cooling chambers bonded to the opposed sides of wafer 10 may be used to receive a circulating cooling fluid pumped from an external source of cooled fluid through inlet pipes and out-let pipes opening into the respective closed cylinders 24 and 26. When one or both of the thinned wall regions 70 or 72 fuses or burns out, the cooling fluid would be contained within the envelope 53. The cooling fluid should be electrically nonconducting so as to not short circuit the fused wall portions of the cooling cylinders. Pure or distilled water could be used as the cooling fluid. Obviously, the wick liners 36 and 38 would not be used in such a pressure circulated fluid cooling system.

I claim:

1. An electrical device comprising an electronic component having a plurality of electrodes for connecting the component into a circuit, at least one cooling chamber bonded to one of said electrodes for cooling said component, said cooling chamber including a metal wall fixed to said one electrode, a connector terminal fixed to a part of said metal wall and spaced from said one electrode, wherein the improvement comprises said metal wall having a thinned wall region completely separating said part of said wall from said electrode.

2. An electrical device in accordance with claim 1, wherein said thinned wall region is spaced from said one electrode by a thicker wall portion of said cooling chamber.

3. An electrical device in accordance with claim 1, wherein said thinned wall region is enclosed within an envelope.

4. An electrical device in accordance with claim 1, wherein said electronic component comprises a semiconductor wafer having at least one major surface, said one electrode formed as a conductive electrode coating bonded to said one major surface, the metal wall of said cooling chamber being electrically bonded to said electrode coating.

5. An electrical device in accordance with claim 4, wherein said electrode coating is one of two electrode coatings respectively bonded to different opposed major surfaces of said wafer, and said cooling chamber is one of two heat pipes each respectively bonded to a different one of said electrode coatings, said thinned wall region formed as an annular wall portion of said one heat pipe.

6. An electrical device in accordance with claim 5, wherein said annular wall portion is spaced from said respective electrode coating by a thicker wall portion of said one heat pipe.

7. An electrical device in accordance with claim 6, wherein said annular wall portion forms an open end of said one heat pipe and is bonded directly to said respective electrode coating.

8. An electrical device in accordance with claim 4, wherein said one major surface of the semiconductor wafer is flat, and said one heat pipe includes a flat metal plate bonded thereto and to said electrode coating.

* * * * *